United States Patent
Iwatsu et al.

(10) Patent No.: US 6,812,569 B2
(45) Date of Patent: Nov. 2, 2004

(54) SEMICONDUCTOR DEVICE USING BUMPS, METHOD FOR FABRICATING SAME, AND METHOD FOR FORMING BUMPS

(75) Inventors: Satoshi Iwatsu, Kanagawa (JP); Noriyuki Honda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/245,697

(22) Filed: Sep. 16, 2002

(65) Prior Publication Data

US 2003/0022478 A1 Jan. 30, 2003

Related U.S. Application Data

(62) Division of application No. 09/844,874, filed on Apr. 27, 2001, now Pat. No. 6,614,111.

(30) Foreign Application Priority Data

Apr. 28, 2000 (JP) ..................................... P2000-134327

(51) Int. Cl.[7] ........................... H01L 23/48; H01L 23/52
(52) U.S. Cl. ....................... 257/737; 257/747; 257/758; 257/768; 257/777
(58) Field of Search ................................ 257/737, 747, 257/758, 768, 777, 689

(56) References Cited

U.S. PATENT DOCUMENTS

| | | | | | |
|---|---|---|---|---|---|
| 5,869,904 | A | * | 2/1999 | Shoji | 257/779 |
| 6,157,080 | A | * | 12/2000 | Tamaki et al. | 257/738 |
| 6,321,734 | B1 | * | 11/2001 | Kaminaga et al. | 123/634 |
| 6,448,665 | B1 | * | 9/2002 | Nakazawa et al. | 257/789 |
| 6,452,256 | B1 | * | 9/2002 | Kazama et al. | 257/668 |
| 6,614,111 | B2 | * | 9/2003 | Iwatsu et al. | 257/737 |

* cited by examiner

*Primary Examiner*—Michael Lebentritt
(74) *Attorney, Agent, or Firm*—Robert J. Depke; Holland & Knight LLP

(57) ABSTRACT

A semiconductor device able to maintain a bonding state between a bump and an electrode and having high reliability even under thermal stress, wherein a sealing resin is interposed to bond the electrodes and bumps between a wiring board formed with a plurality of electrodes and an IC chip formed with a plurality of bumps, the bumps being formed under the condition that the following formula is satisfied.

$$100 < ((\Phi A \times F)/H) < 125$$

where $\Phi A$ represents the top diameter of a bump bonded with an electrode, H the height of a bump projecting from the IC chip and bonded with an electrode, and F the linear thermal expansion coefficient of the sealing resin.

1 Claim, 9 Drawing Sheets

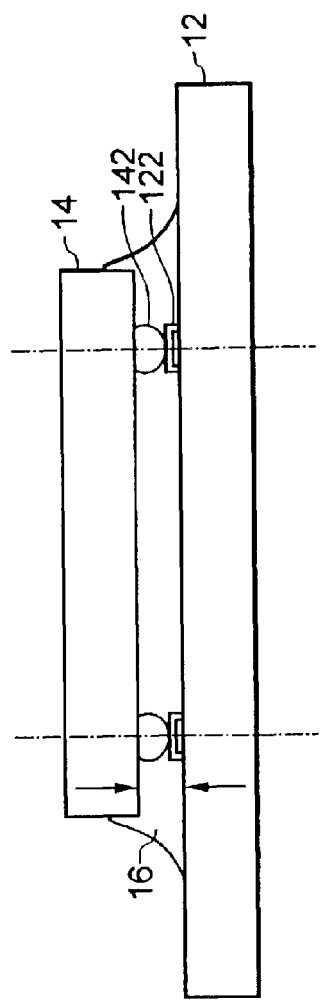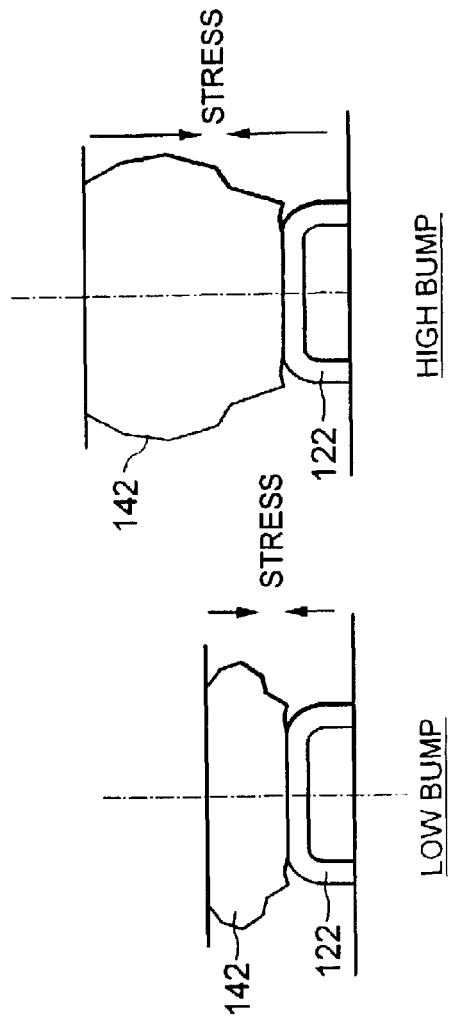

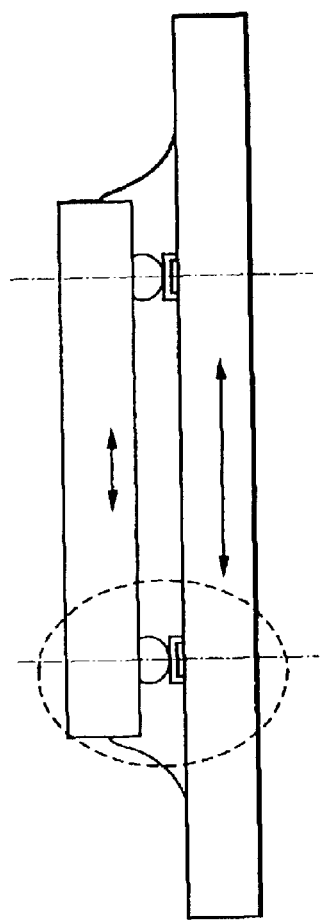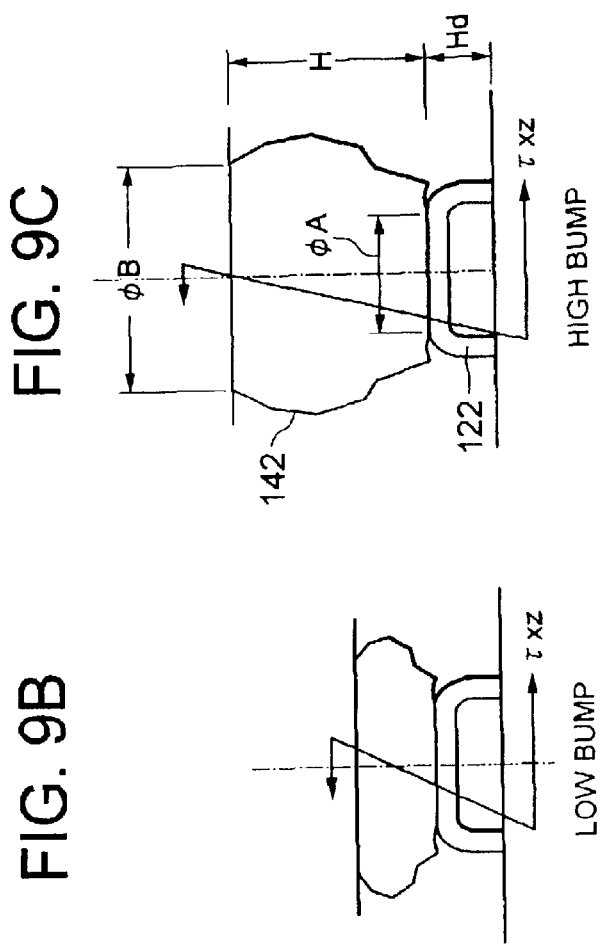

SEMICONDUCTOR DEVICE USING BUMPS, METHOD FOR FABRICATING SAME, AND METHOD FOR FORMING BUMPS

RELATED APPLICATION DATA

The present application is a divisional of U.S. application Ser. No. 09/844,874 filed Apr. 27, 2001 now U.S. Pat. No. 6,614,111, which claims priority to Japanese application P2000-134327 filed Apr. 28, 2000. The present application claims priority to each of these previously filed applications.

BACKGROUND OF THE INVENTION

The present invention relates to a semiconductor device having bumps, a method for fabricating the same, and a method for forming bumps.

More specifically, the present invention relates to a semiconductor device having bumps able to ease thermal stress to prevent damage due to thermal stress and therefore of high reliability, a method for fabricating the same, and a method for forming bumps.

Along with the increasingly small size of electronic apparatuses, attempts have been made to use compact semiconductor packages of sizes similar to the size of a chip of a flip-chip structure. A large number of electronic circuits are integrated on such a small package, so many connection terminals are necessary. On the other hand, due to the reduced size, the problem arises that the space for arranging these connection terminals is insufficient. In such a small semiconductor package, DIPs or other connection terminals of the related art cannot be used.

As a solution to this problem, attempts have been made for flip chip mounting where a large number of small projecting electrodes (bumps) are formed on the bottom surface of a semiconductor integrated circuit chip, many electrodes are formed on a printed wiring board at positions corresponding to those bumps, and the electrodes on the wiring board and the bumps formed on the semiconductor integrated circuit chip are directly bonded. Such flip chip mounting has the advantage that many bumps can be formed even on the bottom surface of a semiconductor integrated circuit chip of a limited space.

As a method for connecting bumps and electrodes, attempts have been made to seal a semiconductor integrated circuit chip and a wiring board by a resin to connect and affix them.

Summarizing the problem to be solved by the invention, a large number of semiconductor integrated circuit chips are of a type using silicon for their semiconductor substrates. The linear thermal expansion coefficient of a silicon chip is much smaller than that of a wiring board. For example, the former is no more than 10% of the latter. As a result of the large difference of the linear thermal expansion coefficients, thermal stress appears when the temperature changes.

In most cases, the linear thermal expansion coefficient of the semiconductor integrated circuit chip is also largely different from that of the sealing resin. Similarly, the linear thermal expansion coefficient of the wiring board is often different from that of the sealing resin.

As a result of the difference of the linear thermal expansion coefficients, when the temperature rises during operation of the semiconductor integrated circuit chip, thermal stress appears between the semiconductor integrated circuit chip and the wiring board between which the sealing resin is interposed.

In a flip-chip structure designed for compactness, there is no mechanism for easing stress such as a lead frame. Therefore, if flip chip mounting is adopted, there could be deformation of the semiconductor integrated circuit chip, decline of bonding between bumps and electrodes, or even loss of the bonded state.

As shown here, although a reduced size is aimed at with flip chip mounting, sometimes the reliability of the semiconductor device could decline because of poor bonding or loss of bonding caused by thermal stress.

Accordingly, it is desirable to improve the reliability against thermal stress for a flip chip mounting semiconductor device which does not have a mechanism such as a lead frame for easing stresses.

SUMMARY OF THE INVENTION

An object of the present invention is to find the conditions for increasing the reliability against thermal stress in a flip chip mounting structure.

Another object of the present invention is to provide a flip chip mounting semiconductor device of high reliability and a method for fabricating such a semiconductor device on the basis of the above conditions.

Still another object of the present invention is to provide a method for forming bumps on a semiconductor integrated circuit chip on the basis of the above conditions.

According to a first aspect of the present invention, there is provided a semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere the wiring board and semiconductor integrated circuit chip, wherein each individual bump is formed under the condition that quantities ΦA, H, and F are in the region defined by the following formula A:

$$a_L < ((\Phi A \times F)/H) < a_u \qquad (A)$$

where,
ΦA denotes the top diameter of a bump bonded with an electrode,
H denotes the height of a bump, defined as the distance from the semiconductor integrated circuit chip to the end of the bump bonded with an electrode,
F denotes the linear thermal expansion coefficient of the sealing resin,
$a_L$ denotes the lower limit, and
$a_u$ denotes the upper limit.

Up until now, it was thought that high bumps were preferable. This is because the large number of bumps formed on a semiconductor integrated circuit chip are uneven in height, the large number of electrodes formed on the wiring board are uneven in height, the bottom surface of the semiconductor integrated circuit chip is not completely flat, and the surface of the wiring board is not completely flat. Furthermore, when a bump and a electrode are bonded, the semiconductor integrated circuit chip and the wiring board may warp or deform. They may also deform due to shrinkage of the sealing resin at time of curing. High bumps are preferable when considering the margin for eliminating such unevenness.

Studies and experiments of the inventors of the present invention have revealed that there are optimal values to dimensions of individual bumps defined by the above formula A.

Note that when considering the height of bumps, the height of electrodes formed on the wiring board should be considered, too.

This is because due to the height of the bumps and the height of the electrodes, a gap is maintained between the wiring board and the semiconductor integrated circuit chip to prevent contact of the wiring board and the semiconductor integrated circuit chip, and the conditions of the sealing resin are optimized for interposition between the wiring board and the semiconductor integrated circuit chip for maintaining bonding of bumps and electrodes and for sealing.

Preferably, the sealing resin is a thermosetting resin.

Further, as a condition for the above formula to stand, the linear thermal expansion coefficient of the wiring board is 10 times that of a semiconductor integrated circuit chip and the linear thermal expansion coefficient of the thermosetting sealing resin is in the range from 20 to 70 ppm.

Specifically, the bump comprises gold, and the electrode comprises a conductive metal.

It is desirable that the electrode be harder than the bump. When applying pressure for bonding, it is desirable that the electrode not deform while the bump deforms.

Preferably, the lower limit $a_L$ is about 100, and the upper limit $a_u$, is about 125.

Specifically, the bump height H is in the range from about 20 $\mu$m to about 25 $\mu$m.

More specifically, the top diameter $\Phi A$ of a bump is no more than 50 $\mu$m.

These regions of the bump height and top diameter $\Phi A$ are realistic bump dimensions giving good reliability against thermal stress.

According to a second aspect of the present invention, there is provided a semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere the wiring board and semiconductor integrated circuit chip, wherein each individual bump is formed under the condition that quantities $\Phi A$ and L are in the region defined by the following formula B, $$(b_1 \times L/2) < \Phi A < (b_2 \times L/2) \quad (B)$$

where, $\Phi A$ denotes the top diameter of a bump bonded with an electrode,

L denotes the interval (distance) between adjacent bumps, $b_1$ denotes a first coefficient, and $b_2$ denotes a second coefficient.

Because the shorter the interval between adjacent bumps, the larger the number of bumps able to be formed, a short interval is desirable. However, studies and experiments of the inventors of the present invention have found there is a limit defined by the above formula B.

For example, the first coefficient $b_1$ is about 0.75, and the second coefficient $b_2$ is about 0.85.

In addition, according to a third aspect of the present invention, there is provided a semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere the wiring board and semiconductor integrated circuit chip, wherein each individual bump is formed under the condition that quantities $\Phi A$, H, and F are in the region defined by the above formula A, and the interval between adjacent bumps is in the region defined by the above formula B.

The semiconductor device according to the third aspect of the present invention is a combination of the semiconductor device satisfying the conditions of bump dimensions according to the above first aspect and the semiconductor device satisfying the conditions of the bump interval according to the above second aspect.

According to the third aspect of the present invention, there is able to provide a semiconductor device displaying reliability against thermal stress and able to be arranged with a practical number of bumps.

In addition, according to a fourth aspect of the present invention, there is provided a method for forming a plurality of bumps on a semiconductor integrated circuit chip used for a semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere the wiring board and semiconductor integrated circuit chip, wherein (a) adjacent bumps are formed under the condition that the interval between adjacent bumps is defined by the above formula B, and (b) each individual bump before bonding with an electrode is formed to have an initial height H0 including an additional part for compensating for deformation caused by bonding so that the dimensions $\Phi A$ and H and the quantity F of each individual bump are in the region defined by the formula A, and each individual bump is formed in a near spherical shape so that the top diameter $\Phi A$ satisfies the formula A after bonding with an electrode, A bump before bonding is formed to have a larger height to include a part for exactly compensating for deformation caused by a pressure during bonding.

In addition, according to a fifth aspect of the present invention, there is provided a method for fabricating a semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere the wiring board and semiconductor integrated circuit chip, the method comprising:

(a) a step for forming bumps, wherein adjacent bumps are formed under the condition that the interval between adjacent bumps is defined by the above formula B, and each individual bump before bonding with an electrode is formed to have an initial height H0 including an additional part for compensating for deformation caused by bonding so that the dimensions $\Phi A$ and H and the quantity F of each individual bump are in the region defined by the formula A, and each individual bump is formed in a near spherical shape so that the top diameter $\Phi A$ satisfies the formula A after bonding with an electrode, (b) a step, which is separate from the bump forming step, for forming electrodes on the wiring board, wherein adjacent electrodes are formed under the condition that the interval between adjacent electrodes is defined by the above formula B, and each electrode is formed so that its head is same as or larger than the top diameter $\Phi A$ of a bump, (c) a step for heating a film-like thermosetting resin on a surface of the wiring board formed with electrodes at a first heating temperature and pressing by a first pressure within a first time period to temporarily fix the thermosetting resin on the wiring board, (d) a step for putting together the semiconductor integrated circuit chip and the wiring board so that each bump formed on the semiconductor integrated circuit chip and each electrode formed on the wiring board face each other with the thermosetting resin interposed between them, and (e) a step for heating and pressing at a temperature higher than the first heating temperature, by a second pressure, and within only a second time period, to satisfy the formula A while the film-like thermosetting resin is interposed between each bump and each electrode that face each other, wherein each bump pushes the film-like thermosetting resin apart and is bonded with an electrode at a corresponding position.

Preferably, the second heating temperature is higher than the glass transition temperature of the thermosetting resin. Because of such a heating temperature, the sealing resin will be completely set in a glass state to reliably bond bumps and electrodes and firmly adhere the wiring board and the semiconductor integrated circuit chip to seal them.

BRIEF DESCRIPTION OF THE DRAWINGS

These and other objects and features of the present invention will become clearer from the following description of the preferred embodiments given with reference to the accompanying drawings, in which:

FIGS. 8A to 8C are views of the stress acting on a bump and an electrode wiring pattern when the bump height is large;

FIGS. 9A to 9C are views of the stress acting on a bump and an electrode wiring pattern when the bump height is small.

DESCRIPTION OF THE PREFERRED EMBODIMENTS

Below, a preferred embodiment according to the present invention will be described with reference to the accompanying drawings.

Figure 1:
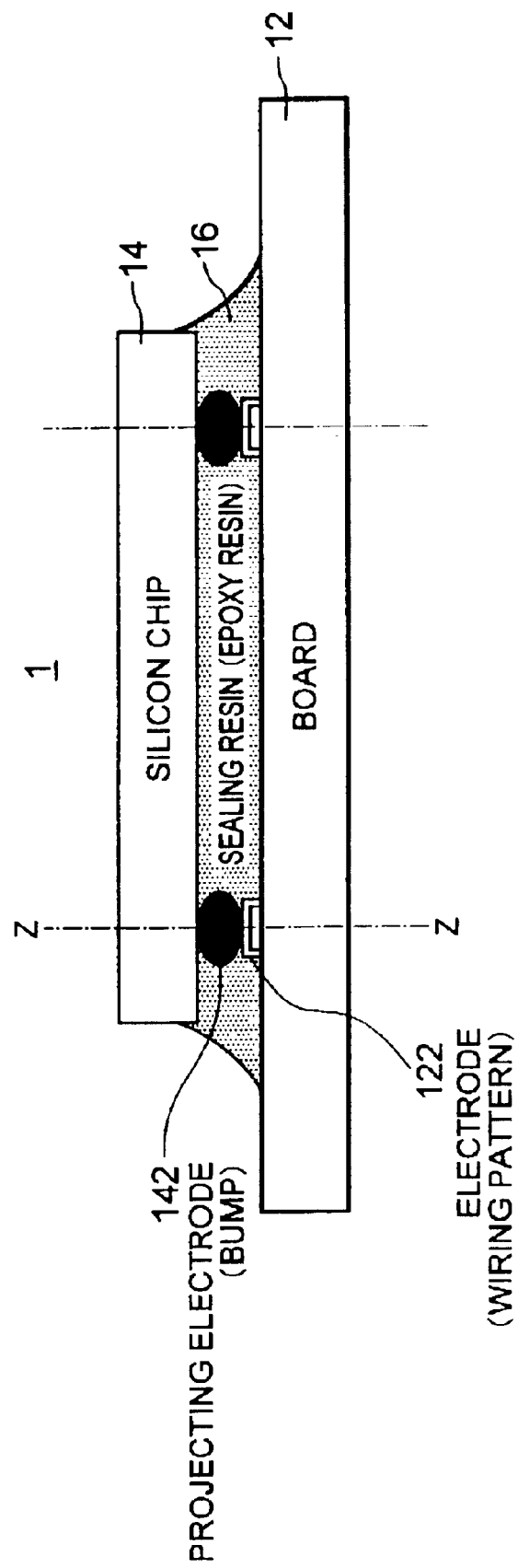
FIG. 1 is a sectional view of the outer appearance of a semiconductor according to an embodiment of the present invention.

FIG. 1 is a sectional view of the outer appearance of a semiconductor device according to an embodiment of the present invention.

The semiconductor device 1 illustrated in FIG. 1 comprises a wiring board 12 and a silicon IC chip 14 as examples of a wiring board and a semiconductor integrated circuit chip of the present invention.

On the surface of the wiring board 12 that faces the IC chip 14, a number of electrodes 122 are formed.

When the wiring board 12 and the IC chip 14 are placed together face-to-face, the electrodes 122 and bumps 142 at corresponding positions contact each other, and the wiring board 12 and IC chip 14 are electrically connected.

Between the wiring board 12 and IC chip 14, there is a predetermined gap over which the electrodes 122 and bumps 142 are connected. In this gap, a thermosetting resin, for example, an epoxy resin or other sealing resin 16 is interposed and is then heated to bond the wiring board 12 and the IC chip 14 and seal the surrounding of the electrodes 122 and bumps 142.

Method for Forming Bumps

A basic method for forming bumps before bonding with electrodes is described below with reference to FIG. 2A to 2C and FIGS. 3A and 3B.

Figure 2A:
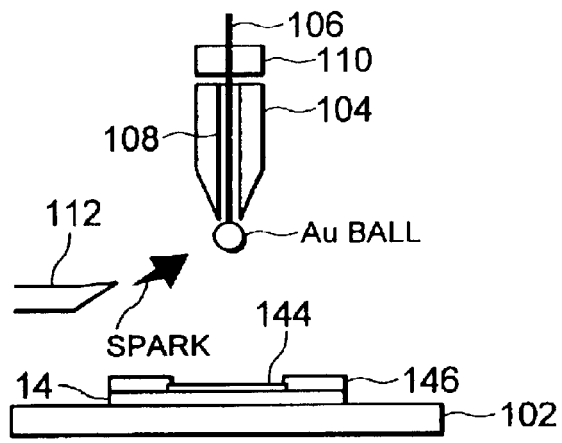
FIG. 2A to 2C are partial views illustrating a basic method for forming a bump before bonding with an electrode.

In FIG. 2A, an IC chip 14 is placed on a heatable working stand 102.

On the IC chip 14, an aluminum pad 144 is formed in a region where a bump will be formed. A passivation film 146 is formed around the pad.

Figure 2B:
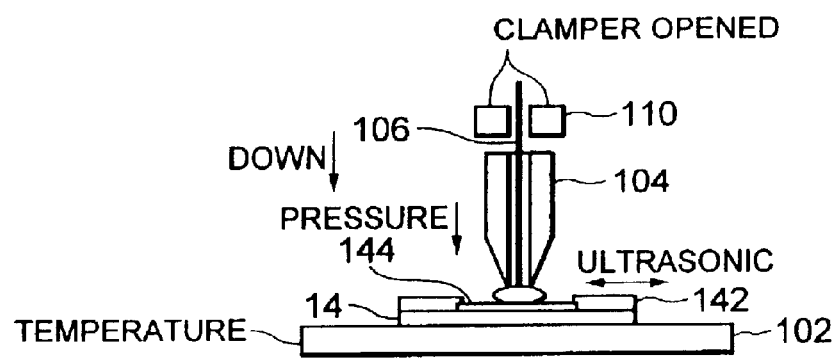
Figure 2C:
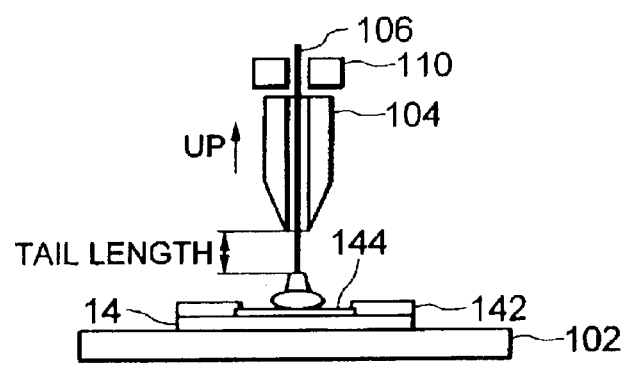

Above the IC chip, a capillary 104 is provided. The capillary 104 is formed with a hole for passing a gold wire 106. Above the capillary 104, a clamper 110 is provided for holding the gold wire 106. In FIGS. 2A to 2C, the clamper 106 holds the upper end of the gold wire 106.

The capillary 104 is moved up and down by a not illustrated hoisting and lowering mechanism. In FIG. 2A, the capillary 104 is moved up at a higher position.

Above the IC chip 14 near the front end of the capillary 104, a torch 112 is provided.

In FIG. 2A, a high voltage is applied to the torch 112, causing the torch 112 to discharge and spark to the end of the gold wire 106 positioned at the end of the capillary 104 positioned near the torch 112. Due to this, the end of the gold wire 106 sticking out from the end of the capillary 104 turns into a gold small spherical body (hereinafter, referred to as a gold ball) which is the forerunner of a bump.

Figure 4:
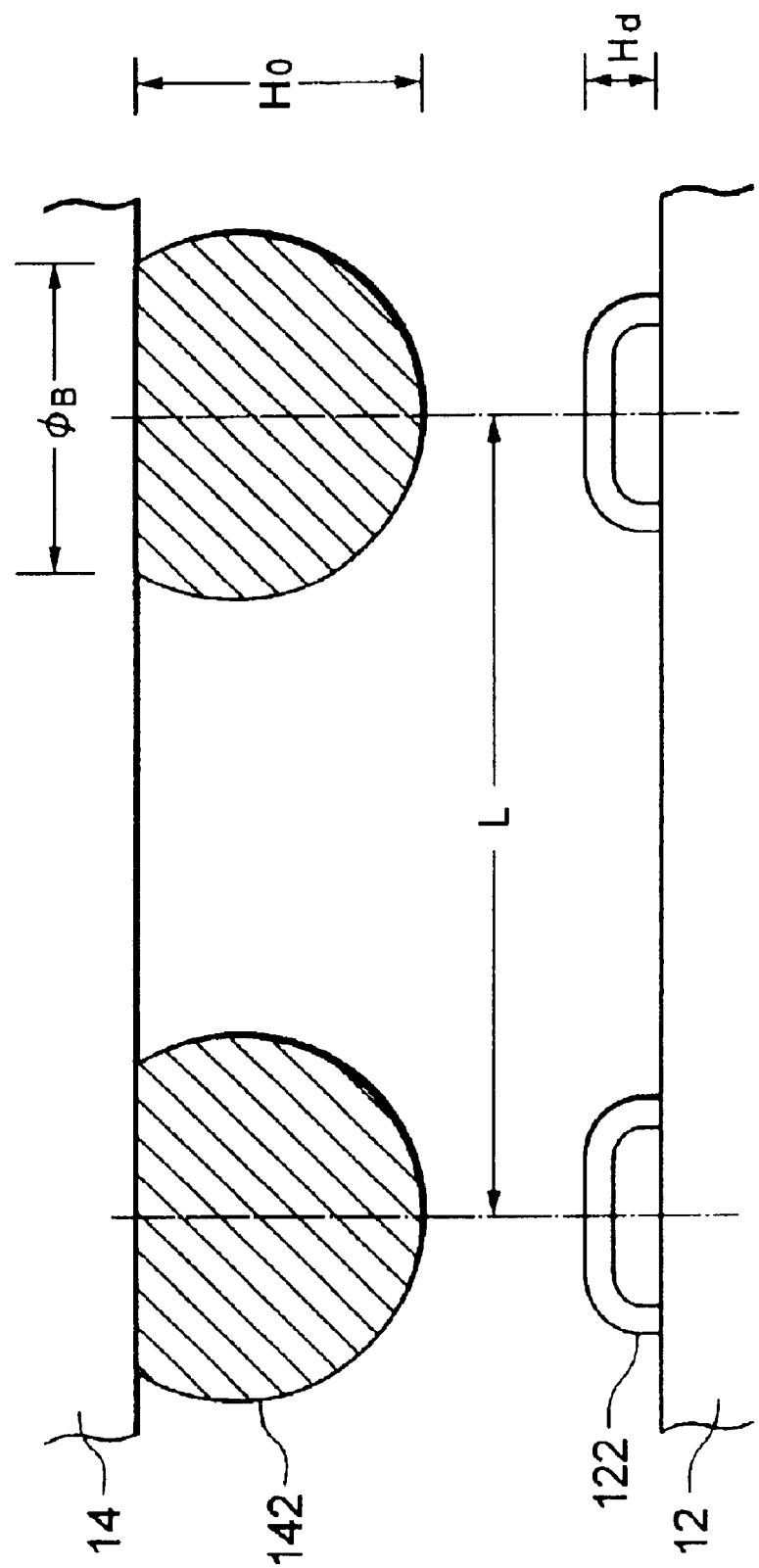
FIG. 4 is an enlarged view of bumps just formed on a semiconductor integrated circuit chip (IC chip) and electrodes formed on a wiring board.

The gold ball 120, which is illustrated as a bump 142 in FIG. 4, is formed in a near spherical shape at the end of the capillary 104.

Below, a brief description will be made of the size of the gold ball 120. The dimensions of the bump 142 will be briefly explained first, and details will be given later. As described in the fourth aspect of the present invention, ΦA, H, and F are used to denote the top diameter of a bump bonded with an electrode, the height of a bump defined as the distance from the semiconductor integrated circuit chip to the end of the bump bonded with an electrode, and the linear thermal expansion coefficient of the sealing resin, respectively. By a leveling operation employing a leveling plate 114 in FIG. 3B and in the way illustrated in FIG. 4, a bump before bonding with an electrode 122 is formed to have an initial height H0 including a part that will be deformed during the bonding process so that the dimensions of the bump 142 will be in the region defined by the above formula A. Namely, it is desirable that a bump not bonded with an electrode 122 yet (gold ball 120) is formed to have a larger height to include exactly the part that will be deformed by the pressure during bonding. In consideration of the deformation caused by such a leveling operation, it is desirable that the gold ball 120 is formed somewhat larger.

The bumps illustrated in FIG. 4 are formed in the above way and then pressed against aluminum pads 144 by a method described later with reference to FIG. 2B and FIG. 2C, whereby part of each bump is changed in shape. Note that the definition of the up-down direction in FIG. 4 is reverse to that in FIGS. 2A to 2C.

In FIG. 2B, the clamper 110 is opened and the gold wire 106 is released. The capillary 104 is lowered toward the aluminum pad 144 on the IC chip 14, and the gold ball 120 formed at the end of the capillary 104 is pressed against the aluminum pad 144 by applying a certain pressure. In this state, an ultrasonic wave is applied and the working stand 102 is heated so that the gold ball 120 is melted and fixed on the aluminum pad 144.

After the gold ball 120 is fixed on the aluminum pad 144, as shown in FIG. 2C, the capillary 104 is hoisted away from the aluminum pad 144 so that the gold wire 106 projects a predetermined length (tail length) out of the capillary 104 for forming the next gold ball. During this operation, the clamper 110 is opened to keep the gold wire 106 released.

Figure 3A:
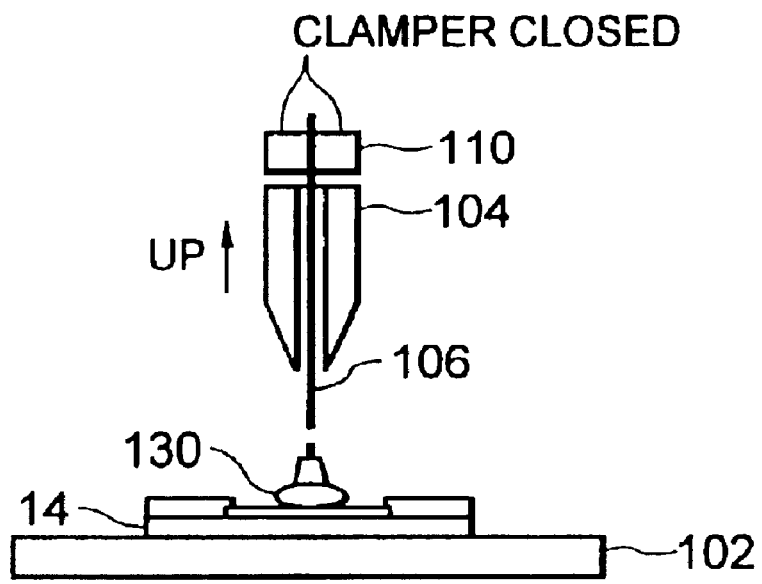
FIGS. 3A and 3B are partial views continuing from FIG. 2A to 2C, illustrating a basic method for forming a bump before bonding with an electrode.

In FIG. 3A, the clamper 110 is closed to hold the gold wire 106. Then, the capillary 104 is moved upward, hence the gold wire 106 is under tension. Due to this tension, at the boundary between the crystal portion of the gold wire 106 and the re-crystalized portion formed by the spark, the gold ball 120 portion is torn off from the gold wire 106 and a bump is formed.

The distance by which the capillary 104 is moved up defines the length of the gold wire 106 sticking out of the end of the capillary 104. The latter in turn defines the size of the gold ball 120 formed by the spark from the torch 112, so it is the ascent or descent distance of the capillary 104 that defines the size of the bump 142 before bonding (gold ball 120). Consequently, in the present embodiment, the size of the gold ball 120 is controlled by the distance moved by the capillary 104.

By this method, a desired number of bumps can be formed sequentially. For this, for example, the working stand 102 may be shifted.

Figure 3B:
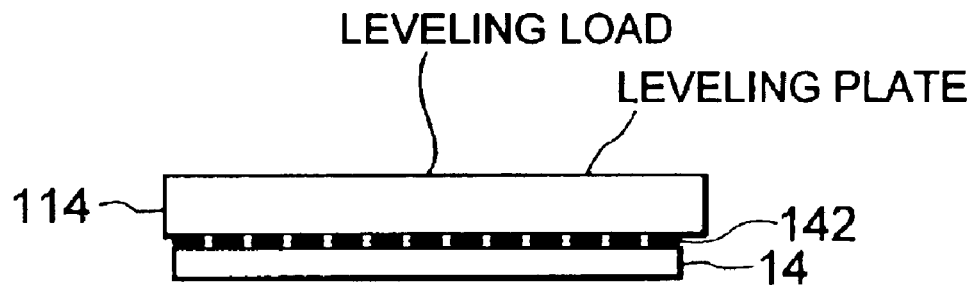

After a desired number of bumps are formed, as shown in FIG. 3B, a leveling plate 114 is placed on these bumps 142 formed on the surface of the IC chip 14 to apply a leveling load so that all the bumps 142 formed on the surface of the IC chip 14 have the same specified height.

While details of the dimensions of the bump 142 will be given later, here, as described in the fourth aspect of the present invention, ΦA, H, and F are used to denote the top diameter of a bump bonded with an electrode, the height of a bump defined as the distance from the semiconductor integrated circuit chip to the end of the bump bonded with an electrode, and the linear thermal expansion coefficient of the sealing resin, respectively. In order for the dimensions of bumps 142 to be in the region defined by the above formula A, it is desirable that each individual bump before bonding with an electrode 122, as illustrated in FIG. 4, is formed to have an initial height H0 including a part which will be deformed during bonding, and a leveling plate 114 is employed to unify the heights of all these bumps. Namely, it is desirable that a bump not bonded with an electrode 122 yet (gold ball 120) is formed to have an excess height to include exactly the part that will be deformed by the pressure during bonding.

Consequently, as shown in FIG. 4, a number of bumps 142 each having a bottom diameter ΦB and height H0 are formed on the surface of the IC chip 14 at a pitch interval L.

FIG. 4 is an enlarged view of bumps 142 just formed on the IC chip 14 and electrodes 122 formed on a later explained wiring board 12.

Method for Forming Electrodes

Below, a description will be given of a method for forming electrodes 122 on the wiring board 12.

The electrodes 122 of height $H_4$ are formed, as shown in FIG. 4, at the same pitch interval as the bumps 142 and at positions corresponding to those many bumps on the IC chip 14 using for example aluminum, copper, or another conductive metal by a well known method of forming electrodes.

In the present embodiments for example, the electrode 122 is formed by using for example copper as its basic portion, and is nickel plated and gold plated then.

The basic material copper is a conductive metal harder than gold of the bumps 142. While bumps 142 are deformed when they are pressed against the electrodes 142 during bonding, it is desirable that the conductive metal forming the basic portion of the electrodes 122 have a high enough rigidity that the electrodes 122 do not deform. Copper may also be replaced by other metals, for example, aluminum.

The outermost gold plating is for raising the bonding ability of both relatively soft metals and preventing erosion when bonding with the gold bumps 142.

The intermediate nickel plating is for enabling stable plating of gold on the surface of copper.

Method for Fabricating Semiconductor Device 1

Below, a description will be given of a method for putting together the wiring board 12 formed with an electrode wiring pattern 122 and the IC chip 14 formed with bumps 142 face-to-face so that the electrode wiring pattern 122 and bumps are connected and for sealing with a sealing resin by the method described above to form the semiconductor device 1 shown in FIG. 1.

(a) A film-like bonding layer of the same size as the IC chip 14 is prepared. As the film-like bonding layer, use is made of for example a film-like bonding layer of a thermosetting adhesive, for example, an epoxy resin.

(b) This film-like bonding layer is placed on the surface of the wiring board 12 where the electrodes 122 are formed. For temporary fixing, for example, this layer is heated to the first heating temperature of 80° C. and applied with the first pressure of 3 kg/cm$^2$ for the first time period of 3 seconds as defined in the present invention. By this heating and pressure, the film-like bonding layer is thermally set and temporarily fixed on the wiring board 12.

(c) Next, the surface of the IC chip 14 where the bumps 142 are formed is made to face the surface of the wiring board 12 where the electrodes 122 are formed, and the corresponding electrodes 122 and bumps 142 are pressed against each other with the thermally set film-like bonding layer in between.

(d) Under this condition, the IC chip 14 and the wiring board are given a higher pressure and heated to a higher temperature than in the preceding temporary fixing step, for example, heated to the second heating temperature of 180° C. to 239° C. and given a second pressure of 3 to 5 kg/cm$^2$ for the second time period of 20 to 30 seconds as defined in the present invention.

By this heating and pressure, the bumps 142 push apart the film-like bonding layer thermally set in a temporary fixing state and are in direct contact (bonding) and electrical connection with electrodes 122 at corresponding positions.

The second heating temperature described above of for example 180° C. to 239° C. is one example of a temperature higher than the glass transition temperature of the thermosetting resin. It is preferable that this heating temperature is higher than the glass transition temperature of the thermosetting resin. Examples of the glass transition temperatures of the sealing resin 16 are shown in Table 1.

Table 1 presents the linear thermal expansion coefficients, modules of elasticity, and glass transition points of sealing resin types A to H.

TABLE 1

Types and Material Properties of Sealing Resins

| Type of resin | Linear thermal expansion coefficient $\alpha 1$ (ppm) | Module of elasticity (GPa) | Glass transition temperature (Tg) |
| --- | --- | --- | --- |
| A | 21 | 7.0 | 163 |
| B | 23 | 6.5 | 140 |
| C | 29 | 9.2 | 140 |
| D | 32 | 4.0 | 138 |
| E | 38 | 3.5 | 138 |
| F | 40 | 4.9 | 140 |
| G | 47 | 4.5 | 119 |
| H | 60 | 2.4 | 134 |

In the present invention, designed to avoid the problem of thermal stress, as described later in detail, although the magnitude of the linear thermal expansion coefficient of a sealing resin 16 is of importance, as the sealing resin 16 of the present embodiment, use can be made of the sealing resins shown in Table 1 which have linear thermal expansion coefficients (ppm) ranging from 20 to 60 or so or, in a wider region, from 15 to 70 or so.

The second pressure causes the bumps 142 to push apart the film-like bonding layer thermally set in a temporary fixing state to come into direct contact with the electrodes 122 at corresponding positions, and deforms the bumps 142 to a certain degree, but it is not so strong as to deform and damage the electrodes 122. For example, it is in the range from 3 to 5 kg/cm².

Due to the above process, the semiconductor device 1 of the structure illustrated in FIG. 1 is formed. Namely, in the state where the bumps of the IC chip 14 and the corresponding electrodes 122 of the wiring board 12 are electrically connected, their surroundings are sealed by the sealing resin 16 and the wiring board 12 and the IC chip 14 are adhered.

Figure 5:
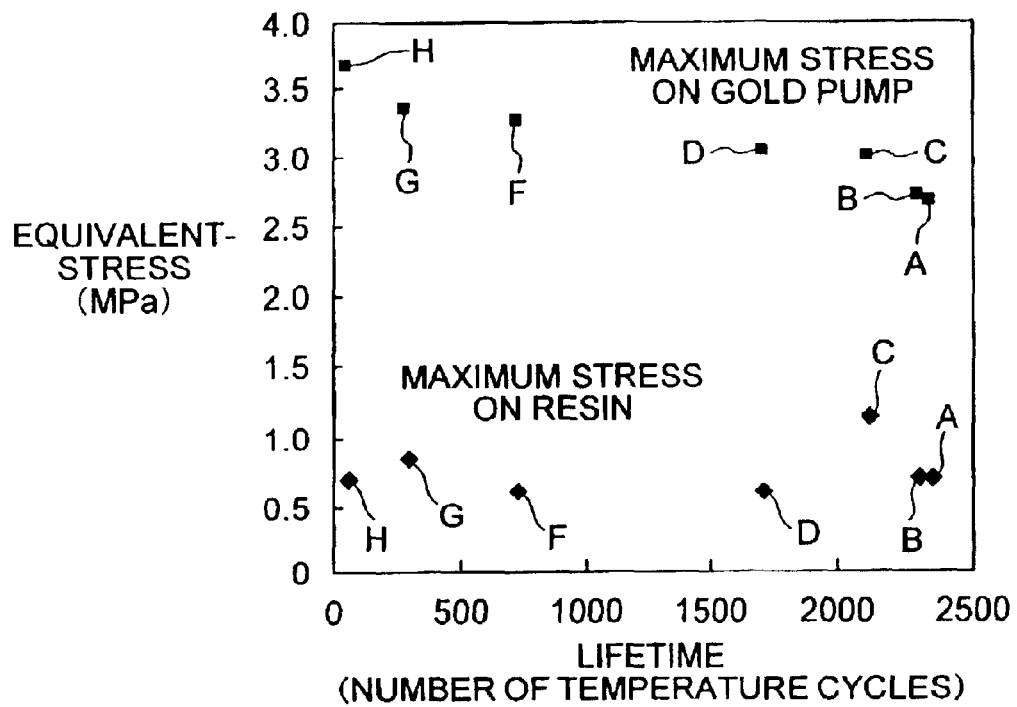
FIG. 5 shows the results of inspection of the thermal fatigue lifetime up to destruction of the semiconductor device in FIG. 1 under a temperature cycle test in a range from −25° C. to 125° C. when forming a semiconductor device by using the resins listed in Table 1 as the sealing resin of the present embodiment.

FIG. 5 shows the results of inspection of the thermal fatigue lifetime up to destruction of the semiconductor device in FIG. 1 under a temperature cycle test in a range from −25° C. to 125° C. when forming a semiconductor device 1 by using the resins A to H listed in Table 1 as the sealing resin 16.

In FIG. 5, the horizontal axis represents the number of temperature cycles, while the vertical axis represents the equivalent-stress (MPa). Note that the equivalent-stress is the von Misess stress.

The results presented in FIG. 5 show that the magnitude of the linear thermal expansion coefficient of the sealing resin 16 does not directly influence the maximum stress of the sealing resin 16, while the maximum stress acting on. the gold bump 142 increases with a rise of the linear thermal expansion coefficient of the sealing resin 16, and the lifetime of the bump 142 becomes short when the linear thermal expansion coefficient of the sealing resin 16 is large. This is because if the linear thermal expansion coefficient of the sealing resin 16 is high, the sealing resin 16 displaces due to thermal stress, and because of the displacement, the bonding portions of the bumps 142 and electrodes 122 are warped. Further, if repeatedly warped, the bonding between bumps 142 and electrodes 122 turns poor or may even be loosened.

From the viewpoint of the thermal stress, a small linear thermal expansion coefficient of the sealing resin 16 results in high reliability.

Figure 6:
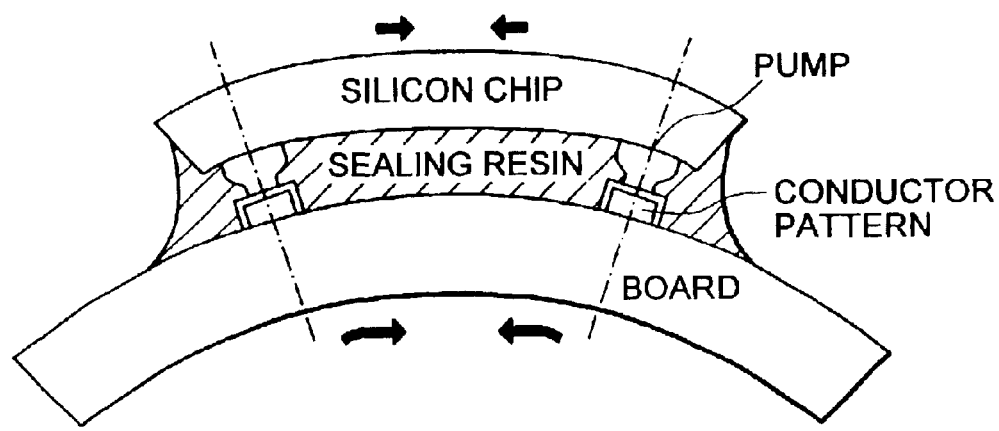
FIG. 6 is a view illustrating the effect of the difference of linear thermal expansion coefficients of a wiring board, an IC chip, and a sealing resin on a semiconductor device when applying a negative temperature load.

If heating in the above way, as illustrated in FIG. 6, because of the difference of linear thermal expansion coefficients of the wiring board 12, IC chip 14, and sealing resin 16, thermal stress begins to act on the semiconductor device 1.

FIG. 6 is a view of a state when a negative temperature load is applied.

The linear thermal expansion coefficient of the IC chip 14 comprising mainly silicon is 10 times smaller than that of the wiring board 12, so when a negative temperature load is applied, the contraction of the wiring board is larger than the IC chip 14, and the wiring board bends to the side of the IC chip 14.

If the semiconductor device 1 is heated to the high temperature side, because the linear thermal expansion coefficient of the sealing resin 16 is larger than that of the electrode 122 side of the wiring board 12, the electrode 122 side of the wiring board 12 expands while the opposite side contracts. In the same way, because the linear thermal expansion coefficient of the bump side 142 of the IC chip 14, which is mainly comprised of silicon, is smaller than that of the sealing resin 16, the sealing resin side of the IC chip 14 expands and the opposite side contracts.

On the contrary, if the semiconductor device 1 is cooled to the low temperature side, expansion and contraction will occur in a way contrary to that shown in FIG. 8.

Such expansion and contraction cause thermal stress acting on the gold bumps 142 of the IC chip 14. FIG. 5 shows the results associated with this situation.

From the results of FIG. 5, it is clear that the thermal fatigue lifetime of the semiconductor device is dominated by the amplitude of the stress occurring on the bonding surface between the gold bumps 142 formed on the IC chip 14 and the wiring pattern 122 formed on the wiring board 12.

Accordingly, in order to improve the reliability of the connection of the semiconductor device 1 against thermal stress, it is desirable to reduce as small as possible the amplitude of the stress which occurs on the bonding surface between the bumps 142 and the electrode wiring pattern 122.

Figure 7:
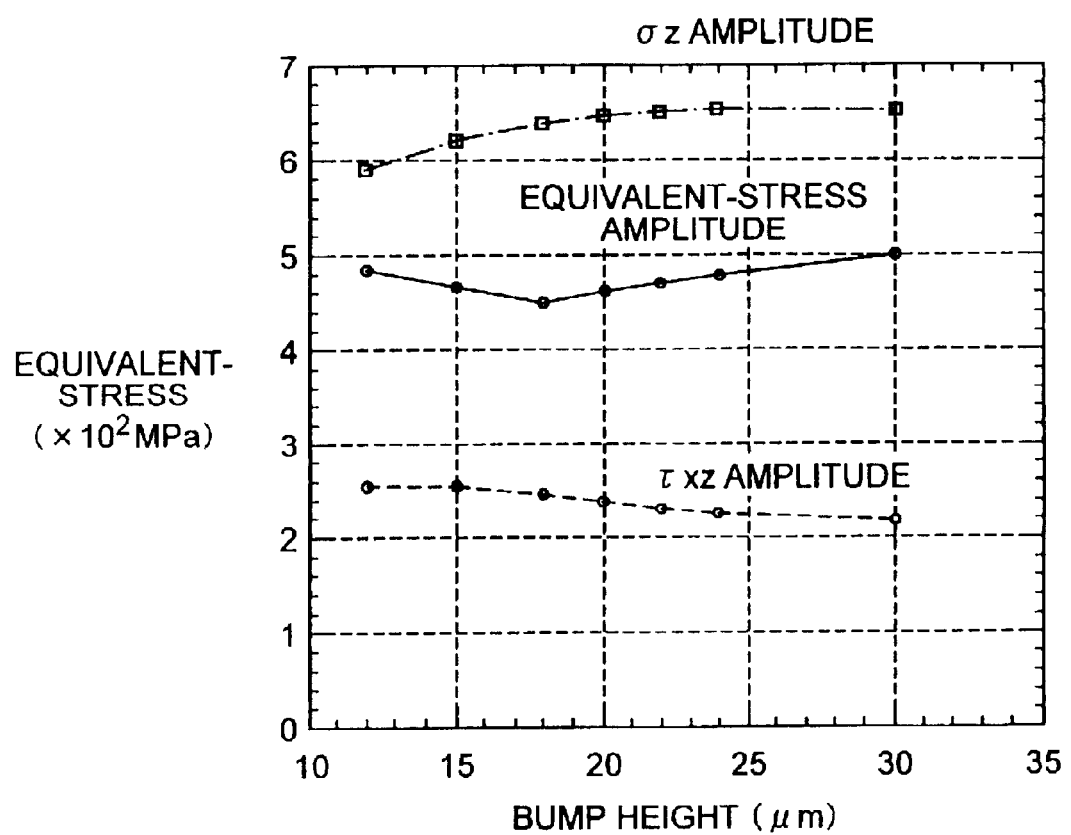
FIG. 7 shows graphs of the results of an analysis of decomposing the stress acting on the bonding surface of a bump with an electrode.

Therefore, the inventors of the present invention did an analysis of decomposing the stress acting on the bonding surface of a bump 142 that is in contact with an electrode 122. The results are presented in FIG. 7. In FIG. 7, the horizontal axis is the bump height, and the vertical axis is the amplitude of the equivalent-stress.

Note that the results shown in this figure were obtained under the conditions of a size of the IC chip 14 of 9 mm×0.4 mm, a thickness of the wiring board 12 of 0.7 mm, a bump 142 of a diameter of 30 $\mu$m at its front end and of a contact diameter of 23 $\mu$m with the electrode wiring pattern 122, and a core material including a 50 $\mu$m build-up layer of FR-4.

The central curve shows the amplitude of the equivalent-stress which was obtained by numerical calculation such as the limited element method.

$\sigma_z$ represents the amplitude of stress in Z direction, namely, along the Z—Z axis in FIG. 1.

$\tau_{xz}$ stands for the amplitude of a shearing stress relevant to the Z—Z direction and the horizontal direction (X direction) perpendicular to the Z—Z direction.

The curve of the amplitude of the equivalent-stress shows the equivalent-stress is a minimum when the bump height is about 18 $\mu$m. The reason is examined below with reference to FIGS. 8A to 8C.

FIGS. 8A to 8C are views illustrating the stress acting on the bumps 142 and electrodes 122.

A larger height of bumps 142 implies a thicker sealing resin 16. That is, the sealing resin 16 contributes to the compressing force or contracting force.

For example, when the sealing resin 16 around the cooled bumps 124 contracts, because the total contraction of the sealing resin 16 in its thickness direction is proportional to its thickness, it increases with the thickness of the sealing resin 16. If this contraction evenly distributes over the entire bump 142, the contraction per unit length (per unit length along the thickness direction) is the same, so the stress on the bump 142 does not increase. This phenomenon happens mainly near the bonding surface between the bump 142 and the electrode wiring pattern 122, which receives a contracting force from the sealing resin 16 and makes the bump 142 contract. Therefore when the bump 142 is high, namely, as illustrated in FIG. 8C, the thickness of the sealing resin 16 is higher than that in FIG. 8B. As the stress $\sigma_z$ acting on the bump 142 increases, the above phenomenon occurs.

In FIG. 8C, warping occurs locally mainly along the edge of the bonding surface of a bump 142 and an electrode 122.

Next, the case of a lower bump 142 will be considered with reference to FIGS. 9A to 9C.

As shown in FIG. 9B, a lower bump 142 implies a close distance between the IC chip 14 having a small linear thermal expansion coefficient and the wiring board 12 having a large linear thermal expansion coefficient. As a result, a shearing stress acts on the bump 142.

If the bump 142 is low, because the metal structures of the IC chip 14 and the wiring board 12 are close, the semiconductor device 1 is bended more, and the shearing stress $\tau_{xz}$ per unit volume increases.

If the bump 142 is high, as shown in FIG. 9C, contrary to FIG. 9B, the warping of the device 1 becomes smaller.

As illustrated in FIG. 5, there is a strong correlation between the thermal fatigue lifetime and the equivalent-stress occurring on the bump 142, so as shown in FIG. 7, the fact that the equivalent-stress is at a minimum relative to the height of the bump 142 implies there is an optimum height of the bump 142 that optimizes the reliability of the semiconductor device 1 against thermal stress.

Figure 10:
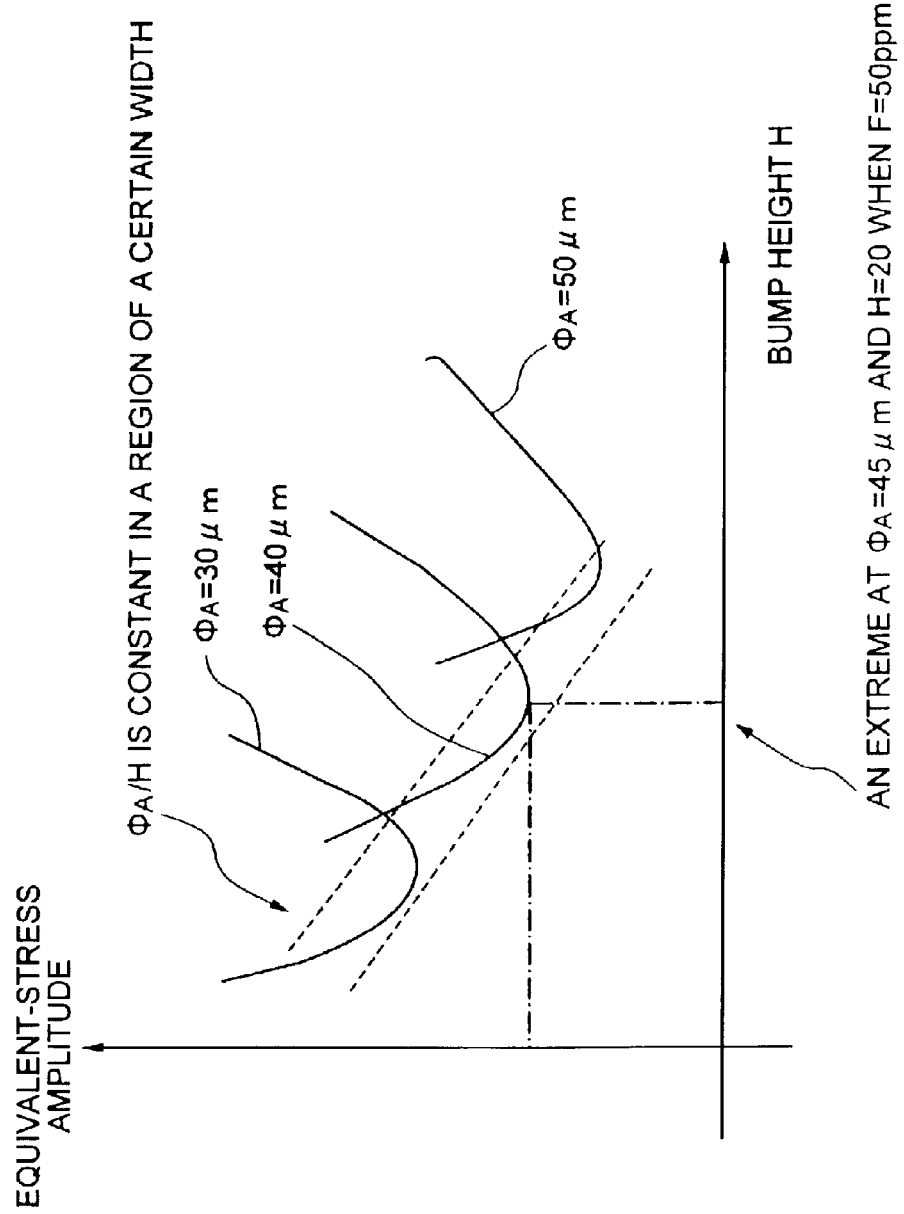
FIG. 10 shows graphs of the relation between the bump height and the equivalent-stress when changing the diameter (referred to as top diameter ΦA) of a bump in contact with an electrode wiring pattern.

The inventors of the present invention performed experiments to search for such an optimum value. The results are presented in FIG. 10, FIG. 10 shows graphs of the relation between the bump height and the equivalent-stress when changing the diameter (referred to as a top diameter $\Phi A$) of a bump 142 in contact with an electrode 122 to $\Phi A$=30 $\mu$m, 40 $\mu$m, and 50 $\mu$m. The horizontal axis represents the bump height, and the vertical axis represents the equivalent-stress.

FIG. 10 shows that there is an optimum value of the bump height that gives a minimum amplitude of the equivalent-stress for a constant top diameter $\Phi A$. Further, the minimum of the amplitude of the equivalent-stress increases with a decreasing top diameter $\Phi A$ of the bump.

Examining the graph of FIG. 10 in more detail, as shown by the two dashed lines, there are an optimum height H and an optimum top diameter $\Phi A$ of a bump that give a constant ratio $\Phi A/H$ with respect to the bump height H.

Further, from the fact that the optimum height of a bump 142 increases with a decreasing linear thermal expansion coefficient F (ppm) of the sealing resin 16, the dimensions of a bump become optimum in the region from $a_L$ to $a_u$, which is the region satisfying the following formula (1):

$$a_L < ((\Phi A \times F)/H) < a_u \quad (1)$$

As shown in FIG. 4 and FIG. 9C, $\Phi B$, H0, H, and $\Phi A$ are used to denote the bottom diameter of the bump 142, the initial height of the bump 142, the height of the bump 124 in contact with an electrode 122, and the top diameter, that is, the diameter of the contacting portion of the bump 142 bonded with an electrode 122.

The height of an electrode is represented by Hd.

After studying various situations of the top diameter $\Phi A$ from the results in FIG. 10, it is found $\Phi A$=45 $\mu$m and H=20 $\mu$m are the optimum values when F=50 ppm.

After experiments on various linear thermal expansion coefficients F of the sealing resin 16 presented in Table 1 and various top diameters $\Phi A$, it is found for a gold bump 142, the preferable height H and top diameter $\Phi A$ of the bump 142 satisfy the following formula. Namely, when $a_L$=100 and $a_u$=125 in formula (1), $$100 < ((\Phi A \times F)/H) < 125 \quad (2)$$

In addition, if considering the matter from a different point of view, a larger top diameter $\Phi A$ of a bump can decrease the amplitude of the equivalent-stress and thus raise the reliability of the semiconductor device 1 against thermal stress. However, because of the constraints from the interval with adjacent bumps 142 and electrodes 122, the top diameter $\Phi A$ of a bump 142 can not be made unlimitedly large.

As shown in FIG. 4, if representing the interval between adjacent bumps as L ($\mu$m), it is found the region defined by the following formula (3) is the permitted region in which the IC chip 14 and the wiring board 12 can be bonded.

$$(b_1 \times L/2) < \Phi A < (b_2 \times L/2) \quad (3)$$

According to the experiments by the inventors, if the coefficients $b_1$=0.75 and $b_2$=0.85, a flip chip of high reliability against thermal stress and a long lifetime can be realized.

$$(0.75 \times L/2) < \Phi A < (0.85 \times L/2) \quad (4)$$

Therefore, in principle, what has to be done is just to form bumps satisfying the formulae (1) and (3) (or formulae (2) and (4)).

In practice, however, if the bump height is less than 20 $\mu$m, because the wiring board 12 sinks when the bumps 142 and the electrode wiring pattern 122 are pressed for bonding, the wiring board 12 may touch the IC chip 14, and there may be insufficient bonding among the many bonded bumps 142 and the electrode wiring pattern 122.

From this point of view, it is concluded the bump height cannot be less than 20 $\mu$m.

Further, it is also clarified if the top diameter $\Phi A$ is less than 50 $\mu$m, the optimum bump height H will not be 25 $\mu$m or more as long as the linear thermal expansion coefficient of the sealing resin 16 is not too small.

From this point of view, when the top diameter $\Phi A$ is less than 50 $\mu$m, the bump height is simply defined by the following formula (5):

$$20 < H(\mu m) < 25 \quad (5)$$

Note that strictly the height of a bump is determined by both the initial height H0 of the bump and the height Hd of an electrode 122. In the present embodiment, the bump height H was studied assuming the total height Hd of an electrode 122 is Hd=16 $\mu$m including for example 12 $\mu$m thick copper, 3 to 5 $\mu$m thick nickel plating, and 0.02 $\mu$m thick gold plating.

Therefore, when the height Hd of an electrode 122 is smaller than the above value, the bump height can be made larger accordingly.

In the above embodiment, the electrode 122 was assumed to be comprised of 12 μm thick copper covered by 3 to 5 μm thick nickel plating and 0.02 μm thick gold plating, gold was used for the bump 142, and the sealing resins 16 listed in Table 1 were used, but the present invention is not limited to this embodiment. Numerous materials and thicknesses are applicable.

In addition, as an example, the semiconductor integrated circuit chip of the present invention is described as an IC chip using silicon, but the invention is not limited to silicon-based IC chips. For example, a chip using a compound semiconductor may also be used.

Numerous modifications can also be made without departing from the basic concept and scope of the present invention.

Summarizing the effects of the invention, according to the present invention, the conditions have been found for avoiding poor bonding or losing bonding between a projecting electrode (bump) formed on a semiconductor integrated circuit chip and an electrode formed on a wiring board even under thermal stress.

According to the present invention, based on such conditions, a flip chip semiconductor device of high reliability can be provided.

What is claimed is:

1. A semiconductor device comprising a wiring board formed with a plurality of electrodes, a semiconductor integrated circuit chip formed with a plurality of bumps, and a sealing resin for bonding the electrodes and bumps at corresponding positions and further surrounding the bonding portions of the electrodes and bumps to adhere said wiring board and semiconductor integrated circuit chip, wherein each individual bump and adjacent bumps are formed under the condition that quantities ΦA and L are in the region defined by the following formula B, $$(b_1 \times L/2) < \Phi A < (b_2 \times L/2) \quad (B)$$

where,

ΦA denotes a lop diameter of a bump bonded with an electrode;

L denotes an interval (distance) between adjacent bumps;

$b_1$ denotes a first coefficient; and $b_2$ denotes a second coefficient;

wherein said first coefficient $b_1$ is about 0.75, and said second coefficient $b_2$ is about 0.85.

* * * * *